United States Patent [19]

Drori et al.

[11] Patent Number: 4,668,932
[45] Date of Patent: May 26, 1987

[54] NONVOLATILE REPROGRAMMABLE ELECTRONIC POTENTIOMETER

[75] Inventors: Joseph Drori; William S. J. Check, both of San Jose, Calif.

[73] Assignee: Xicor, Inc., Milpitas, Calif.

[21] Appl. No.: 759,599

[22] Filed: Jul. 26, 1985

[51] Int. Cl.[4] .............................................. H01C 10/16
[52] U.S. Cl. ........................................ 338/48; 365/46; 323/354
[58] Field of Search ......................... 338/48, 306, 307; 365/46; 323/354, 352, 353

[56] References Cited

U.S. PATENT DOCUMENTS

| | | | |
|---|---|---|---|
| 2,999,228 | 9/1961 | Facciola | 365/46 X |
| 3,069,598 | 12/1962 | Darly et al. | 338/307 X |
| 3,890,602 | 6/1975 | Tomisawa et al. | 365/46 |
| 3,964,087 | 6/1976 | Mallon | 338/306 |
| 4,271,486 | 6/1981 | Dagostino et al. | 365/46 X |
| 4,468,607 | 9/1984 | Tanaka | 323/354 |

Primary Examiner—George H. Miller, Jr.
Assistant Examiner—M. M. Lateef
Attorney, Agent, or Firm—Fitch, Even, Tabin & Flannery

[57] ABSTRACT

A variable impedance circuit for use in an external circuit. The impedance value may be altered by an external circuit. The invention consists of a plurality of two terminal impedance elements connected in series. A node is provided between each pair of impedance elements in the series chain. At least one of the first element and last elements in the series chain are connected to terminals which are accessible for connection to the external circuit. Each of the nodes may be connected to a terminal which is also accessible for connection to the external circuit. An electrically reprogrammable read-only memory stores the identity of the node connected such that the identity of this node is retained when power is removed from the invention. When power is returned to the invention, the node which was previously connected to the terminal is automatically reconnected.

21 Claims, 2 Drawing Figures

NONVOLATILE REPROGRAMMABLE ELECTRONIC POTENTIOMETER

The present invention relates generally to the field of variable impedance elements and more specifically to the field of programmable variable impedance elements for use in electrical circuits.

Electronic circuits containing variable impedance elements are well known to the art. These variable impedance elements are usually in the form of variable resistors, also called potentiometers. However, circuits using variable inductors or capacitors are also well known. These variable impedance elements are usually manually adjusted to provide a selected impedance so as to affect some aspect of the circuit in which they are located. For example, a potentiometer may be set to a value which maximizes a signal generated at a node in a given circuit.

Manual adjustment of potentiometers is usually unsatisfactory in circuits under the control of data processing systems or other external electric circuits where ongoing adjustment of the potentiometer is necessary for circuit operation. The data processing system often must change the value of the variable impedance element in a time that is short relative to the time required to complete a manual adjustment of the variable impedance element. Manual adjustment also requires the presence of a human operator which is impractical in many situations in which variable impedance elements are employed.

Potentiometers which are adjusted mechanically by motors or other actuators under external control are also known to the prior art. Although these potentiometers relieve the need for an operator, they are still unsatisfactory in many applications. First, the time to make an adjustment is still too long for many applications. Second, the long term reliability of such electromechanical devices is not sufficient for many applications requiring variable impedance elements. Finally, such systems are often economically unattractive.

Special purpose integrated circuit variable impedance elements which allow the level of attenuation to be adjusted under the digital control of an external data processing system are known to the prior art. For example, Tanaka, et al., U.S. Pat. No. 4,468,607, teaches a ladder attenuator which is controlled by a binary number by means of a switch circuit. Depending on the state of the switches in this switch circuit, one or more stages of attenuation are introduced into the signal path. These variable impedance circuits are tailored to specific attenuation needs and hence fail to satisfy the need for a general purpose attenuation circuit which may be controlled by an external circuit.

Furthermore, these prior art variable attenuation integrated circuits have no ability to store the selected attenuation value when power is removed from the circuit, and consequently no ability to automatically reestablish the same attenuation value once power is restored. Hence, an external means for reinitializing these variable impedance element attenuation values was required when power was returned to the attenuation circuit. This increased the complexity of the circuits containing such variable impedance elements. It also could result in damage to the circuit containing the variable impedance element if the impedance specified by said variable impedance element at power-up was not compatible with other parameters of the external circuit in question.

Variable impedance elements are often used to generate an analog voltage which controls the operation of the circuitry to which said variable voltage is applied. Unless the impedance specified by said variable impedance element is nonvolatile, this information is lost during short power failures. Often the time needed to regenerate this information is long. For example, temperature control circuitry for maintaining the temperature in precision environmental chambers must store the long term average of the power levels of various heating elements in these chambers. This information is usually stored in the form of an analog voltage which is used to control one or more of the heating elements. If power is lost for a short period of time, the information stored in this voltage is lost and must be regenerated by observing the operation of the various heating elements for an extended period of time. During this regeneration period, the environmental control systems will not function with the same precision with which they functioned prior to the loss of power. The prior art does not provide a simple means for measuring and storing an analog voltage during a power failure and then restoring that analog voltage level when power is resumed.

Finally, it should be noted that the construction of the typical prior art variable impedance circuit results in an impedance element whose impedance varies with temperature. Typically, a potentiometer consists of a continuous strip of resistive material having terminals at one or both ends and a "wiper" which makes contact with the resistive material at a location between the two ends in question. The variable impedance is set by setting the position of the wiper relative to one end. This has the effect of inserting a variable length of resistive material into the circuit in question. For any single resistive material, the resistivity will change as a function of temperature. To construct a resistor whose resistance does not vary with temperature, one normally connects two resistors in series. Each resistor is made from a different resistive material. The materials are chosen such that one has a positive temperature coefficient and the other has a negative temperature coefficient. Thus when the temperature changes, the resistance of one resistor will increase with temperature and that of the other will decrease. The series combination of the two, however, will remain essentially constant. The construction of such a combination of two materials using a center-tap potentiometer with a wiper which makes contact along a continuous strip of resistive material is difficult with mechanical potentiometers, since it would require the manufacturer of a continuous resistive strip with alternating regions of materials having different temperature coefficients.

Accordingly, it is an object of the present invention to provide a variable impedance element which may be controlled by an external data processing system or other external circuit without the need for manual adjustment of the variable impedance element.

It is a further object of the present invention to provide a variable impedance element having an impedance which may be rapidly altered.

It is a still further object of the present invention to provide a variable impedance element which automatically retains a selected attenuation value when power is removed from the variable impedance element and which automatically reestablishes this attenuation value when power is restored to the variable impedance element.

It is a still further object of the present invention to provide a means for storing an analog voltage prior to a power failure and then restoring said analog voltage when power is restored.

It is yet another object of the present invention to provide a variable impedance element whose impedance does not change significantly with temperature.

Yet another object of the present invention is to provide a nonvolatile variable impedance element contained on a single integrated circuit chip.

Still another object of the present invention is to provide a digital up/down counter which enables externally digital up/down and increment pulses to select a desired attenuation value.

These and other objects of the invention will be apparent from the following detailed description and the accompanying drawings.

SUMMARY OF THE INVENTION

The present invention consists of a general purpose variable impedance circuit which may be used in place of a center-tapped potentiometer in a circuit under the control of a data processing system or other external circuit. The impedance value specified by the present invention may be rapidly altered by the external circuit or data processing system. The invention consists of a plurality of two terminal impedance elements connected in series. A node is provided between each pair of impedance elements in the series chain. The first element in the series chain is connected to a first terminal which is accessible for connection to the external circuit and is connected to the second element of the series chain at the first node. Similarly, the last element in the series chain is connected to a second terminal which is accessible for connection to said external circuit, said last element being connected to the next to the last element in the series chain at the last of said nodes. Each of said nodes may be connected to a third terminal which is also accessible for connection to said external circuit. Only one of said nodes can be connected to this third terminal at a given time. The node which is connected is specified by signals to the invention which result in a selected one of a plurality of electrically controllable switches being closed. Each such switch is connected to one of said nodes and to the third terminal. The invention includes an electrically reprogrammable nonvolatile memory which stores the identity of the switch that is closed. When power is lost and then restored to the variable impedance circuit according to the present invention, the node which was previously connected to said third terminal is automatically reconnected to said third terminal.

The node which is connected to the third terminal is determined by the state of an up/down counter which is coupled to a decoding circuit. Each output of said decoding circuit is connected to one of said electrically controllable switches. The entire circuit is contained on a single integrated circuit chip. A chip select input is used to enable the up/down counter to change state in response to signals on two counter input terminals. When the chip select input changes from the enabled to not enabled state, the state of the up/down counter is stored in a nonvolatile electrically reprogrammable read-only memory. When power is applied to the present invention, the state stored in this nonvolatile memory is transferred to the up/down counter.

One or more complete resistive variable impedance circuits can be constructed on a single integrated circuit chip. Each resistor may also be constructed from a series combination of two resistive elements having different temperature coefficients. These coefficients are chosen such that the combination of these two elements is a resistor whose resistance does not change significantly over a wide range of temperatures.

Finally, this resistive variable impedance circuit may be combined with an oscillator, voltage source, and voltage comparator to produce a circuit which digitally stores an analog voltage in a circuit coupled to it, and thereafter regenerates the analog voltage, as desired. This is accomplished by using the comparator output to control the up/down counter of the present invention such that a voltage generated by the combination of the voltage source and the variable impedance provided by the present invention tracks the analog voltage in question. At selected times, e.g., when power is removed from the circuit, the variable impedance specified by the present invention is stored in the nonvolatile memory of the present invention. In this latter example, the circuit operates to reset the variable impedance when power is restored, such that the analog voltage is restored to its value prior to the power interruption.

DETAILED DESCRIPTION OF THE INVENTION

Figure 1:
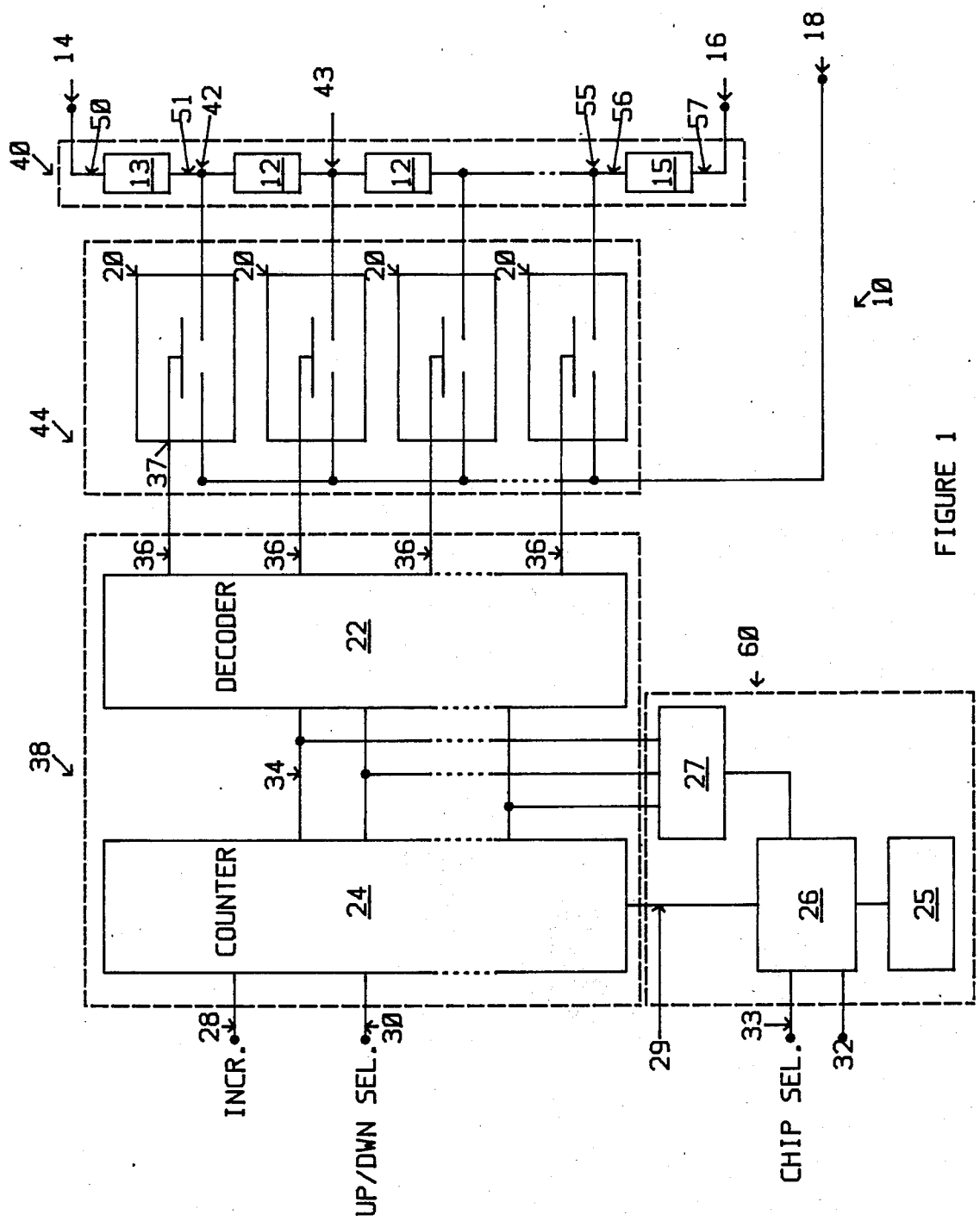
FIG. 1 illustrates the preferred embodiment of a nonvolatile reprogrammable potentiometer according to the present invention.

An apparatus according to the present invention is shown schematically at 10 in FIG. 1. Broadly, it consists of a series chain of impedance elements 40 and a means for accessing said chain. The series chain 40 comprises a plurality of two terminal impedance elements connected in series. The series chain 40 has a first element 13, a last element 15, and one or more intermediate impedance elements 12. Each of the intermediate impedance elements 12 is connected to the impedance element adjacent to it at a node, of which node 43 is typical. One terminal 50 of the first impedance element is connected to a first terminal 14. The other terminal 51 of said first impedance element 13 is connected to the first intermediate impedance element at node 42. Similarly, the last impedance element 15 has one of its terminals 56 connected to the adjacent intermediate impedance element at node 55. The other terminal 57 of said last element 15 is connected by said accessing means to a second terminal 16. At least one of said terminals 50 and 57 is accessible to an external circuit connected to the apparatus of the present invention. The accessing means connects a selected one of said nodes to a third terminal 18.

In the preferred embodiment, the impedance elements are resistors. Other embodiments, however, in which the impedance elements are capacitors, inductors, or a combination of one or more of these three types of impedance elements will be obvious to those skilled in the art. In the preferred embodiment, each of the impedance elements provides the same impedance. Embodiments in which the impedance elements are of different impedance values will also be obvious to those skilled in the art.

In the preferred embodiment, each of the resistors in the series chain 40 consists of a series combination of two resistive elements. The first such element is chosen to have a positive temperature coefficient, and the second such element is chosen to have a negative temperature coefficient. The temperature coefficients in question are selected such that the series or parallel combination of the two elements is a resistive element having an essentially zero temperature coefficient. As is well known to those skilled in the art of integrated circuit fabrication, such elements may be fabricated by constructing a polysilicon line and diffused resistor with opposite temperature coefficients.

The accessing means includes connecting means for connecting a selected node to the terminal 18 as shown at 44 in FIG. 1. It also includes means 38 for selecting which node is so connected, and means 60 for storing the identity of the selected node connected to said third terminal 18 and for causing said node to be reconnected to said third terminal 18 when power is reapplied or restored to the apparatus.

The connecting means 44 consists of a plurality of electrically controllable switches, one tied to each node in said chain 40 of which 20 is typical. One terminal of each electrically controllable switch is connected to a respective one of said nodes. The other terminal of each switch is connected in common with all other corresponding switch terminals to said third terminal 18. Each electrically controllable switch may be closed by applying a signal to a control terminal of which terminal 37 is typical. When an electrically controllable switch is closed, the node to which it is connected is connected to said third terminal 18. Only one of said electrically controllable switches is closed at a given time. In the preferred embodiment, each electrically controllable switch is a conventional MOSFET.

The selecting means 38, which determines which electrically controllable switch is closed at a given time, includes one output line 36 for each electrically controllable switch present in the apparatus of the present invention. In the preferred embodiment, the selecting means 38 consists of a counter 24 connected to a decoder circuit 22. In an embodiment in which there are N electrically controllable switches, the counter 24 has N states. The decode circuit 22 applies a signal to one of N output lines 36 in response to the state of said counter 24. When an appropriate signal is applied to a chip select line 33, the state of said counter may be incremented or decremented by signals on counter input terminals 28 and 30 which are accessible to an external circuit connected to the apparatus of the present invention. In the preferred embodiment, counter increment pulses INCR are coupled to counter 24 via terminal 28 and an up/down control select signal UP/DN SEL. is coupled to counter 24 via terminal 30.

Storage means 60 is connected to the counter 24. Said storage means stores the state of the counter 24 in response to a preselected signal. In the preferred embodiment, the storage means 60 consists of a control circuit 26, a nonvolatile memory means 25, and a means 27 for detecting the state of the counter 24. The nonvolatile memory means 25 has N states corresponding to the N states of the counter 24. The state of the counter 24 may be set to the state indicated by said storage means by a signal applied to terminal 32. In the preferred embodiment, this preselected signal is the powering-up of the apparatus of the present invention.

In the preferred embodiment, the memory means 25 is an electrically reprogrammable read-only memory (EEPROM). The preferred EEPROM is one which requires only 5 V to operate, i.e., it contains circuitry for generating the higher voltage required by such EEPROM circuits as a part of said EEPROM circuitry. Such EEPROM's are well known to those skilled in the art of integrated circuits. Each of the N states corresponding to the states of the counter 24 is specified by data stored in a plurality of storage locations in said EEPROM. The time required to store a value in such read only memories is significantly longer than the time needed to change the state of a counter. More importantly, EEPROM's usually have a lifetime that is a function of the number of writes performed to the memory. It is therefore preferable to minimize such write operations. Hence, the contents of the memory are only updated when an appropriate signal is detected by the apparatus of the present invention. The preferred signal is a change in state of a chip select line 33 from the state allowing incrementing and decrementing of the counter 24 to the state inhibiting said incrementing and decrementing. This allows the counter 24 to change state without waiting for the memory to store a new value at each state change. When a final value for the counter state is reached, the control circuit 26 is signaled, and the state of said counter is stored in said electrically reprogrammable read-only memory. When a preselected signal is applied to the control circuit 26 on line 32, the counter 24 is incremented until the signals on its output lines 34 correspond to the pattern stored in the memory means 25.

In the preferred embodiment, line 32 is connected to the terminal on which power is applied to the apparatus. The transition from 0 volts to 5 volts is used to signal the control current 26 to set the state of the counter 24. Two-state circuits which enter a predetermined first state when power is applied to them are conventional in the art. The control circuit 26 includes such a circuit connected to line 32. The control circuit 26 senses the state of said circuit. If the state so sensed is said predetermined first state, the control circuit increments the counter 24 to the appropriate counter state by generating signals on line 29 and then resets said two state circuit to its second predetermined state.

Other means for selecting which node is connected to said third terminal 18 will be obvious to those skilled in the art. For example, a selecting means 38 consisting of a binary shift register in which all of the bits are set to "0" except for one bit which contains a "1" could also be used. Each bit in said shift register would be connected to a corresponding electrically controllable switch control terminal. In this embodiment, the choice of which node is connected to said third terminal 18 would be made by shifting the contents of said register either up or down by signals on appropriate control lines. The state of said shift register could be stored in an electrically reprogrammable memory which has one bit corresponding to each of the bits in said shift register. In response to a preselected signal, said shift register would be shifted until its output lines matched the pattern stored in said electrically reprogrammable memory in a manner analogous to incrementing the counter 24 until its output lines match the pattern stored in the electrically reprogrammable memory contained in the storage means 60.

Figure 2:
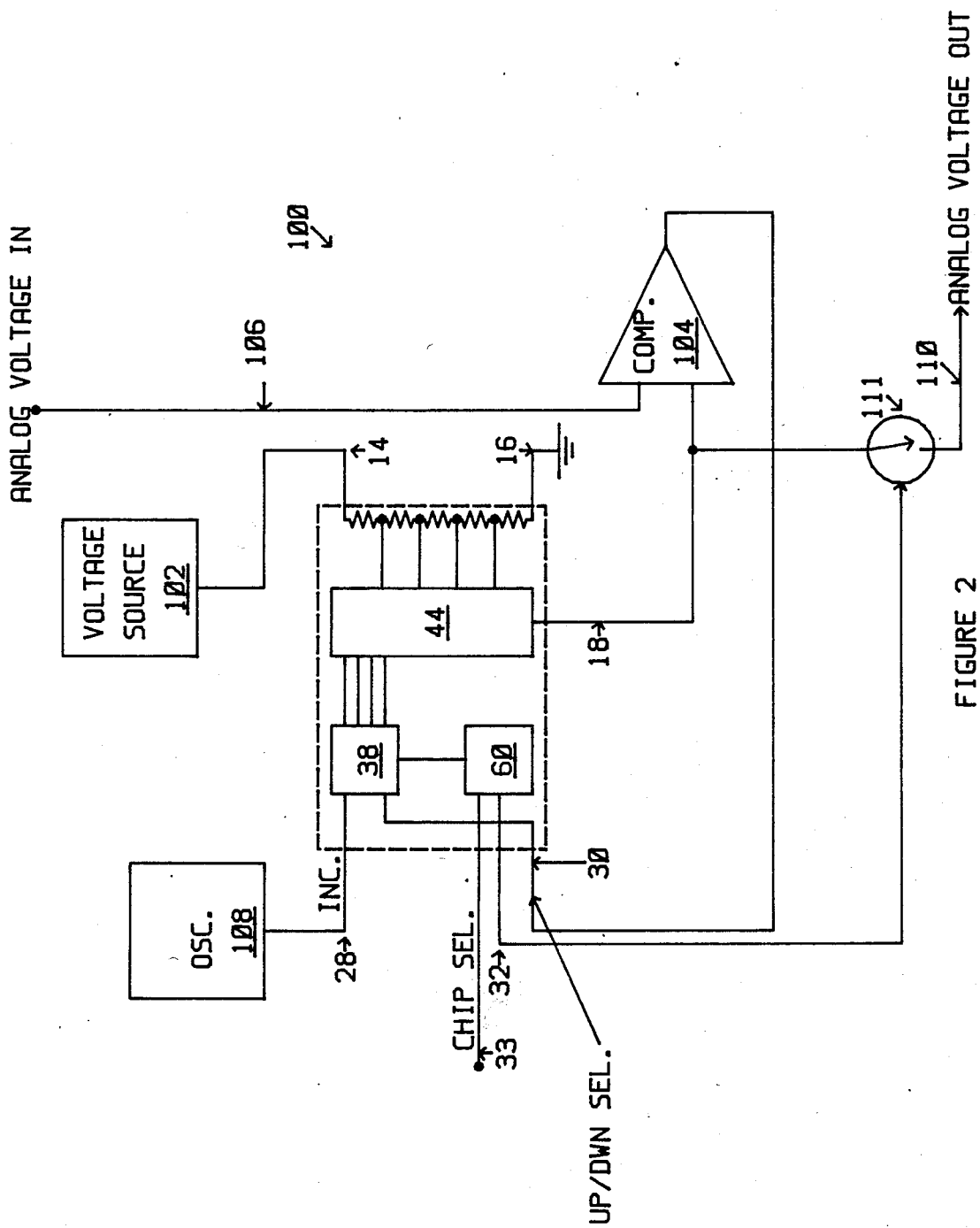
FIG. 2 illustrates a second embodiment of the present invention wherein an external voltage is stored and regenerated.

By including a voltage source, a comparator circuit and an oscillator, the apparatus of the present invention can be used to provide means for storing and regenerating an analog voltage in an external circuit connected to it. Such a circuit is shown at 100 in FIG. 2. An analog voltage is generated on terminal 18 of the present invention by connecting a voltage source 102 across the variable impedance chain using terminals 14 and 16. This internally generated analog voltage is compared to an analog voltage appearing on line 106 which is to be stored by the apparatus. This comparison is performed by a comparator 104. The output of the comparator 104 is coupled to the up/down select terminal 30 of the present invention. An oscillator 108 is connected to the counter input terminal 28 used to receive signals for incrementing and decrementing the counter 24 shown in FIG. 1. The chip select line 33 and the control line 32 are used to control when the nonvolatile memory is updated and when it updates counter 38 and causes an analog voltage to be generated on line 110. A conventional analog switch 111 may be controlled by control line 32. In the exemplary use of this circuit to retain the value of an input voltage when power is lost, the chip select line 33 and control line 32 are coupled to the power line which is to be monitored for a voltage interruption. When power is present on this line, the apparatus of the present invention will continuously increment and decrement the counter 24 shown in FIG. 1 in response to any changes in voltage on line 106. This will result in the analog voltage present on output line 110 tracking the analog voltage on input line 106. If the analog voltage on line 106 increases, the output of the comparator will cause the counter 24 to be incremented on each pulse of the oscillator 108. If said voltage decreases, the comparator output voltage will cause the counter 24 to be decremented on each oscillator pulse. When power is interrupted, the change in the power level sensed by control line 33 will result in the value stored in the counter 24 being transferred to the nonvolatile memory 25 shown in FIG. 1. When power is restored, this value will be restored to counter 24 and hence the analog voltage present on line 110 prior to the power interruption will be restored on line 110. Conventional means, such as a capacitor may be included in the power line which supplies power to the present invention to assure that sufficient power is available to power the apparatus when power is interrupted. This capacitor need only store sufficient power to allow the contents of the counter 24 to be stored in the nonvolatile memory 25.

Various modifications will be apparent to those skilled in the art without departing from the present invention as claimed.

What is claimed is:

1. A variable impedance circuit comprising:
    a plurality of two terminal impedance elements connected in series including a node between each pair of said impedance elements;
    a first terminal connected to the terminal of the first said impedance element which is not connected to a said node;
    a second terminal connected to the terminal of the last said impedance element which is not connected to a said node;
    means for accessing at least one of said first and second terminals;
    means responsive to a predetermined electrical signal for accessing a selected said node including a third terminal;
    nonvolatile memory means for storing the identity of the selected said node in response to a first predetermined signal, the identity of said node remaining stored therein in the absence of electrical power; and
    means for causing the node whose identity is stored in said nonvolatile memory means to be connected to said third terminal in response to a second predetermined signal.

2. The variable impedance circuit of claim 1 wherein said means for accessing a selected said node comprises a plurality of electrically controllable switches, each said switch including a switch control terminal, one of said switches being connected to each of said nodes and to said third terminal, each switch causing an electrical connection to be made between the node to which it is connected and said third terminal when a switch actuation signal is applied to said switch control terminal.
    means for generating said switch actuation signal and for coupling said switch actuation signal to a selected switch control terminal.

3. The variable impedance circuit of claim 2 wherein said means for applying a signal to a selected switch control terminal comprises:
    counting means responsive to a preselected signal for specifying one of N states, where N is the number of said nodes, and including N output terminals, wherein one of said output terminals is connected to a corresponding said switch control terminal and wherein a signal is generated on the Ith said output terminal when said counting means is in the Ith said state.

4. The variable impedance circuit of claim 3 wherein said counting means comprises a digital counter having a counting range from one to N operatively connected to a decoding circuit having N output terminals.

5. The variable impedance circuit of claim 1 wherein each of said impedance elements includes a resistor.

6. The variable impedance circuit of claim 5 wherein each said resistor comprises a series combination of first and second resistive elements, said first resistive element having a positive temperature coefficient of resistance and said second resistive element having a negative temperature coefficient of resistance.

7. The variable impedance circuit of claim 1 wherein each of said impedance elements includes a capacitor.

8. The variable impedance circuit of claim 1 wherein said impedance elements includes an inductor.

9. The variable impedance circuit of claim 1 wherein said nonvolatile memory means is an electrically reprogrammable read-only memory.

10. The variable impedance circuit of claim 1 wherein said second predetermined signal comprises applying power to said variable impedance circuit.

11. The variable impedance circuit of claim 3 further comprising:
    chip select means having a first state in which said counting means is inhibited from changing state in response to said preselected signal and a second state in which said counting means changes state in response to said preselected signal, wherein;
    said first predetermined signal comprises a change from said second state to said first state.

12. The variable impedance circuit of claim 10 wherein said variable impedance circuit is contained on a single integrated circuit chip.

13. The variable impedance circuit of claim 4 wherein said digital counter further comprises:
   count terminal means for receiving a first electrical signal specifying that the count contained in said counter is to be changed by one;
   select terminal means for receiving a second electrical signal specifying whether said count is to be incremented or decremented in response to said first electrical signal; and
   means coupled to said count terminal means and said select terminal means for changing the count contained in said counter by one.

14. The variable impedance circuit of claim 4 wherein said digital counter further comprises:
   counter terminal means for receiving an electrical signal specifying that the count contained in said counter is to be increment; and
   means coupled to said count terminal means for incrementing the count contained in said counter by one.

15. A variable impedance circuit comprising:
   a plurality of two terminal impedance elements connected in series including a node between each pair of said impedance elements;
   a first terminal connected to the terminal of the first said impedance element which is not connected to a said node;
   a second terminal connected to the terminal of the last said impedance element which is not connected to a said node;
   means for accessing at least one of said first and secodn terminals;
   a third terminal;
   a plurality of electrically controllable switches, each said switch including a switch control terminal, one of said switches being connected to each of said nodes and to said third terminal, each said switch causing an electrical connection to be made between the node to which it is connected and said third terminal when a signal is applied to said switch control terminal;
   counting means responsive to a preselected signal for specifying one of N states, where N is the number of said nodes, and N utput terminals, wherein one of said output terminals is connected to a corresponding said switch control terminal and wherein a signal is present on the Ith said output terminal when said counting means in in the Ith said state;
   nonvolatile memory means for storing the identify of said specified one of N states, said specified state identity remaining stored therein in the absence of electrical power;
   means responsive to a preselected storage signal for causing said nonvolatile memory means to specify the state corresponding to the current state specified by said counting means; and
   means responsive to a preselected reset signal for causing said counting means to specify the state corresponding to the state specified by said nonvolatile memory means.

16. The variable impedance circuit of claim 15 wherein said impedance elements are resistors.

17. The variable impedance circuit of claim 15 wherein said nonvolatile memory means is an electrically reprogrammable read-only memory.

18. The variable impedance circuit of claim 15 further comprising:
   chip select means having a first state in which said counting means is inhibited from changing state in response to said preselected signal and a second state in which said counting means changes state in response to said preselected signal, wherein;
   said storage signal comprises a change from said second state to said first state.

19. The variable impedance circuit of claim 15 wherein said reset signal comprises applying power to said variable impedance circuit.

20. The variable impedance circuit of claim 15 wherein said variable impedance circuit is contained on a single integrated circuit chip.

21. A circuit for storing and restoring an analog voltage comprising:
   a plurality of two terminal impedance elements connected in series including a node between each pair of said impedance elements;
   voltage source means for providing a preselected voltage;
   means for coupling said voltage source means to the terminal of the first said impedance element which is not connected to a said node;
   means for causing the terminal of the last said impedance element which is not connected to a said node to be at a zero voltage;
   a third terminal;
   means for accessing said third terminal;
   a plurality of electrically controllable switches, each said switch including a switch control terminal, one of said switches being connected to each of said nodes and to said third terminal, each said switch causing an electrical connection be be made between the node to which it is connected and said third terminal when a signal is applied to said switch control terminal;
   oscillator means for providing periodic electrical pulses;
   means for coupling an analog voltage to said circuit;
   comparator means coupled to said third terminal and to said analog voltage coupling means for comparing the voltage present on said third terminal with said analog voltage and for providing an output signal indicative of the difference between said analog voltage and the said voltage present on said third terminal;
   counting means coupled to said oscillator means said comparator means for specifying one of N states, where N is the number of said nodes, and N output terminals, wherein one of said output terminals is connected to a corresponding said switch control terminal, wherein a signal is present on the Ith said output terminal when said counting means is in the Ith said state, and wherein said counting means is incremented on each said oscillator pulse if said comparator output signal indicates that said analog voltage is greater than the said voltage present on said third terminal, and said counting means is decremented on each said oscillator pulse if said comparator output signal indicates that said analog voltage is less than the said voltage present on said third terminal;
   nonvolatile memory means for storing the identity of said specified one of N states, said specified state identity remaining stored therein in the absence of electrical power;

means for sensing first and second control signals;
means responsive to said first control signal for causing said nonvolatile memory means to specify the state corresponding to the current state specified by said counting means; and
means responsive to said second control signal for causing said counting means to specify the state corresponding to the state specified by said nonvolatile memory menas when said sensing means senses that said voltage has been restored.

* * * * *